(12) United States Patent
Payne

(10) Patent No.: US 7,474,126 B2
(45) Date of Patent: Jan. 6, 2009

(54) PARALLEL BIPOLAR LOGIC DEVICES AND METHODS FOR USING SUCH

(75) Inventor: Robert F. Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/626,871

(22) Filed: Jan. 25, 2007

(65) Prior Publication Data
US 2008/0143388 A1 Jun. 19, 2008

Related U.S. Application Data

(60) Provisional application No. 60/870,836, filed on Dec. 19, 2006.

(51) Int. Cl.
*H03K 19/20* (2006.01)
*H03K 19/086* (2006.01)

(52) U.S. Cl. .................. 326/126; 326/124; 326/127

(58) Field of Classification Search .............. 326/115, 326/126–127, 104, 124; 327/407, 411
See application file for complete search history.

(56) References Cited

U.S. PATENT DOCUMENTS

| 4,229,729 | A |   | 10/1980 | Devendorf et al. |
| 4,617,475 | A |   | 10/1986 | Reinschmidt |
| 5,315,176 | A | * | 5/1994 | Popescu ............ 326/126 |
| 6,265,901 | B1 | * | 7/2001 | Stern et al. ......... 326/126 |
| 6,677,784 | B2 | * | 1/2004 | Yang ................ 326/127 |
| 2006/0255996 | A1 |   | 11/2006 | Li et al. |

* cited by examiner

*Primary Examiner*—Anh Q Tran
(74) *Attorney, Agent, or Firm*—Warren L. Franz; Wade J. Brady, III; Frederick J. Telecky, Jr.

(57) ABSTRACT

Various logic gates and methods for using such are disclosed herein. For example, some embodiments of the present invention provide parallel differential logic gates. Such logic gates include two or more differential input pairs. The collectors of the first transistors in each of the differential pairs are all electrically coupled to an upper voltage via a first load resistor. Similarly, the collectors of the second transistors in each of the differential pairs are all electrically coupled to an upper voltage via a second load resistor. Depending upon the relative values selected for the first and second load resistors, the gate operates as an AND gate or an OR gate.

20 Claims, 2 Drawing Sheets

PARALLEL BIPOLAR LOGIC DEVICES AND METHODS FOR USING SUCH

CROSS REFERENCE TO RELATED APPLICATIONS

The present application claims priority to (is a non-provisional filing of) U.S. Provisional Patent Application No. 60/870,836 entitled "PARALLEL BIPOLAR LOGIC DEVICES AND METHODS FOR USING SUCH" and filed Dec. 19, 2006 by Payne. The aforementioned application is assigned to an entity common hereto and is incorporated herein by reference for all purposes.

BACKGROUND OF THE INVENTION

The present invention is related to logic devices, and more particularly to differential logic devices.

Differential Emitter coupled logic has been used to create multiple input stacked gates. As an example, FIG. 1 shows a two input differential AND gate 100 implemented in emitter coupled logic. As shown, AND gate 100 includes two differential input pairs 107, 111, with one stacked upon the other. One pair of differential inputs 132, 134 are applied to the respective bases of a transistor 106 and a transistor 108 of differential pair 107. Another pair of differential inputs 136, 138 are applied to the respective bases of a transistor 110 and a transistor 112 of differential pair 111. Both differential pair 107 and differential pair 111 are biased by the same current source generated by applying a bias voltage 140 to a transistor 116 that is electrically coupled to ground (VSS 142) via a resistor 114. The collector of transistor 106 is electrically coupled to VDD 130 via a resistor 102, and to the base of an emitter follower transistor 128. The collector of transistor 108 is electrically coupled to VDD 130 via a resistor 104, and to the base of an emitter follower transistor 126. The collector of transistor 112 is also electrically coupled to the base of emitter follower transistor 126. The collector of transistor 110 is electrically coupled to the emitters of transistor 106 and transistor 108. Resistor 102 and resistor 104 are the same value. Emitter follower transistor 126 is biased by a transistor 120 and a resistor 118, and emitter follower transistor 128 is biased by a transistor 124 and a resistor 122. Two sets of differential outputs are provided from AND gate 100: an upper biased pair including Y 184 and YZ 182; and a lower biased pair including YEFZ 186 and YEF 188. As the input bias required into each stage may be slightly different, the two pairs of differential outputs are necessary depending upon the next stage to be driven. This is one of the significant disadvantages of differential emitter coupled logic.

In operation, when both input 132 is asserted high relative to input 134, and input 136 is asserted high relative to input 138, output Y 184 is asserted high with respect to output YZ 182 and output YEF 188 is asserted high with respect to output YEFZ 186. In this case, transistor 106 and transistor 110 are turned on, and the tail current sourced by transistor 114 traverses resistor 102, transistor 106 and transistor 110. No current traverses resistor 104 as transistor 108 and transistor 112 are turned off. Thus, the voltage level at the base of emitter follower transistor 128 (Vb is VDD$-I_{tail}*R_{102}$) is lower than that at the base of emitter follower transistor 126 (Vb is near VDD 130). Thus, YEF 188 is greater than YEFZ 186 indicating a logic '1' value. In contrast, where either or both of input 132 or input 136 are asserted low relative to input 134 or input 138, respectively, the tail current sourced by transistor 114 traverses resistor 104, and no current traverses resistor 102. Thus, the voltage level at the base of emitter follower transistor 126 (Vb is VDD$-I_{tail}*R_{104}$) is lower than that at the base of emitter follower transistor 128 (V is near VDD 130).

One problem with the design of AND gate 100 is that considerable head room is needed between VDD 130 and VSS 142 as there are voltage drops through three transistors and through two resistors. This headroom limitation becomes more acute as additional inputs are added to a particular gate. For example, a three input AND gate includes an additional stacked differential input. In such a case, there are voltage drops through four transistors and through two resistors. Thus, such an approach to logic gates is severely limited in the number of inputs that may be handled in the same logic gate. Further, such an approach to logic gates requires the use of higher voltage power supplies, which can be a disadvantage in many design situations.

As another example of the same emitter coupled logic architecture, FIG. 2 shows a three input differential OR gate 200. As shown, OR gate 200 includes three differential input pairs 207, 211, 215 each stacked one upon the other. One pair of differential inputs 232, 234 is applied to the respective bases of a transistor 206 and a transistor 208 of differential pair 207. Another pair of differential inputs 236, 238 is applied to the respective bases of a transistor 210 and a transistor 212 of differential pair 211. Yet another pair of differential inputs 240, 242 is applied to the respective bases of a transistor 214 and a transistor 216 of differential pair 215. Each of differential pair 207 differential pair, 211 and differential pair 215 are biased by the same current source generated by applying a bias voltage 244 to a transistor 218 that is electrically coupled to ground (VSS 246) via a resistor 220. The collector of transistor 206 is electrically coupled to VDD 230 via a resistor 202, and to the base of an emitter follower transistor 231. The collector of transistor 208 is electrically coupled to VDD 230 via a resistor 204, and to the base of an emitter follower transistor 229. The collectors of transistor 212 and of transistor 216 are also electrically coupled to the base of emitter follower transistor 229. The collector of transistor 210 is electrically coupled to the emitters of transistor 206 and transistor 208. The collector of transistor 214 is electrically coupled to the emitters of transistor 210 and transistor 212. Resistor 202 and resistor 204 are the same value. Emitter follower transistor 229 is biased by a transistor 224 and a resistor 222, and emitter follower transistor 231 is biased by a transistor 228 and a resistor 226. Two sets of differential outputs are provided from OR gate 200: an upper biased pair including Y 282 and YZ 284; and a lower biased pair including YEFZ 288 and YEF 286. Again, the need for two sets of differential outputs is a disadvantage of the existing emitter coupled logic architecture. The three pairs of input differential pairs 207, 211, 215 likewise require input signals that are offset at three differential common mode levels.

In operation, when all of input 232, input 236 and input 240 are asserted high with respect to inputs 234, 238, 242, respectively; the tail current tail current sourced by transistor 218 traverses resistor 202, and no current traverses resistor 204. In this condition, the voltage level at the base of emitter follower transistor 231 (V is VDD$-Y_{tail}*R_{202}$) is lower than that at the base of emitter follower transistor 229 (V is near VDD 230). Thus, YEFZ 288 is greater than YEF 286. In contrast, where any of input 232, input 236 and/or input 240 is/are asserted low with respect to inputs 234, 238, 242, respectively; the tail current sourced by transistor 218 traverses resistor 204, and no current traverses resistor 202. Thus, the voltage level at the base of emitter follower transistor 229 (V is VDD$-Y_{tail}*R_{104}$) is lower than that at the base of emitter follower transistor 231 (V is near VDD 130).

Three input OR gate 200 has the same problem as the previously discussed two input AND gate in that considerable head room is needed between VDD 230 and VSS 246 as there are voltage drops through four transistors and through two resistors. This headroom limitation becomes more acute as additional inputs are added to a particular gate. For example, a four input OR gate includes an additional stacked differential input. In such a case, there are voltage drops through five transistors and through two resistors. Thus, such an approach to logic gates is severely limited in the number of inputs that may be handled in the same logic gate. Further, such an approach to logic gates requires the use of higher voltage power supplies, which can be a disadvantage in many design situations.

Hence, for at least the aforementioned reasons, there exists a need in the art for advanced logic architectures.

BRIEF SUMMARY OF THE INVENTION

The present invention is related to logic devices, and more particularly to differential logic devices.

Some embodiments of the present invention provide methods for implementing logic. Such methods include providing a first differential input pair and a second differential pair. The collector of a first transistor of the first differential pair is electrically coupled to the collector of a first transistor of the second differential pair, and to an upper voltage via a first resistor. Further, the collector of a second transistor of the first differential pair is electrically coupled to the collector of a second transistor of the second differential pair, and to the upper voltage via a second resistor. The method further includes selecting a first resistive value associated with the first resistor to be different from a second resistive value associated with the second resistor. The difference between the first resistive value and the second resistive value yields a particular type of logic gate. In some cases, the particular type of logic gate is an AND gate, while in other cases, the particular type of logic gate is an OR gate. The aforementioned first and second resistors may be either passive resistors or active resistors.

Other embodiments of the present invention provide differential logic gates. Such logic gates include a first differential input pair and a second differential input pair. The first differential pair receives a first differential input, and the second differential pair receives a second differential input. The collectors of each of a first transistor of the first differential pair and a first transistor of the second differential pair are each electrically coupled to an upper voltage via a first resistor. The collectors of each of a second transistor of the first differential pair and a second transistor of the second differential pair are each electrically coupled to an upper voltage via a second resistor. In some instances of the aforementioned embodiments, the first resistor has a resistive value that is different from that of the second resistor. Selection of this difference causes the logic gate to operate either as an AND gate or an OR gate. The first resistor and the second resistor may be either passive or active resistive loads. In some instances of the aforementioned embodiments, the logic gate includes a differential output at a single offset level, in contrast to the prior art gates that include two distinct outputs at different offset levels.

Various instances of the aforementioned embodiments include a third differential pair that receives a third differential input. The collector of a first transistor of the third differential pair is electrically coupled to the upper voltage via the first resistor, and the collector of a second transistor of the third differential pair is electrically coupled to the upper voltage via the second resistor. In such cases, the resistive value of the first resistor and that of the second resistor may be selected to be different, with the difference between the resistive values being selected to yield either an OR gate function or an AND gate function that is applied to the three differential inputs.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by referenced to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to logic devices, and more particularly to differential logic devices.

Figure 1:
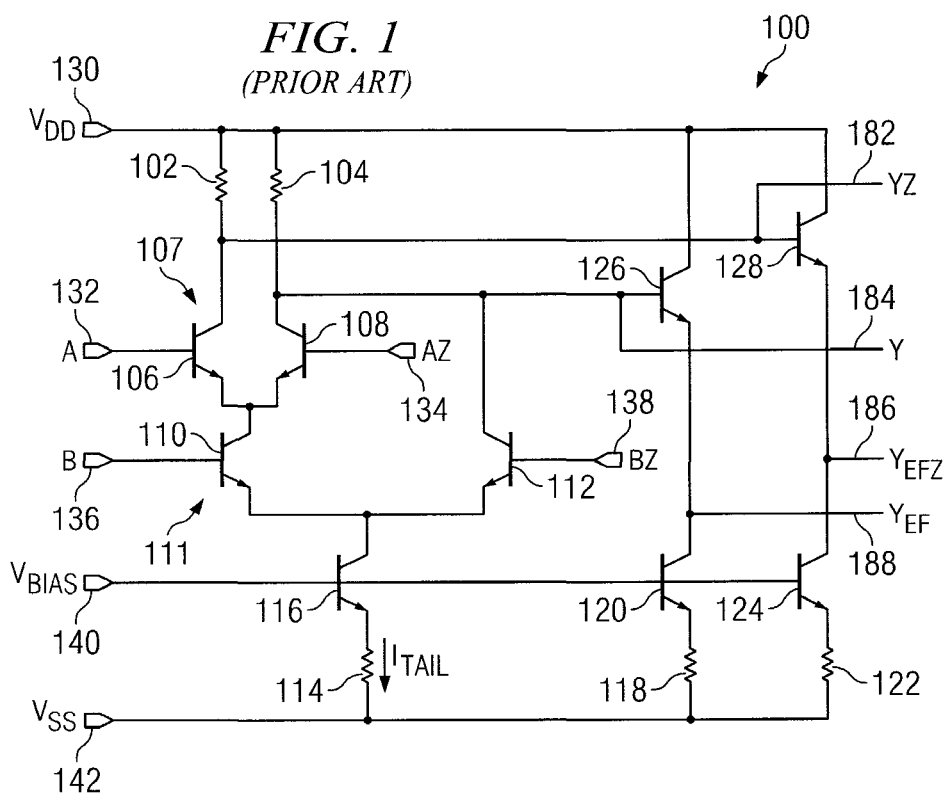
FIG. 1 shows a prior art two input differential AND gate.
Figure 2:
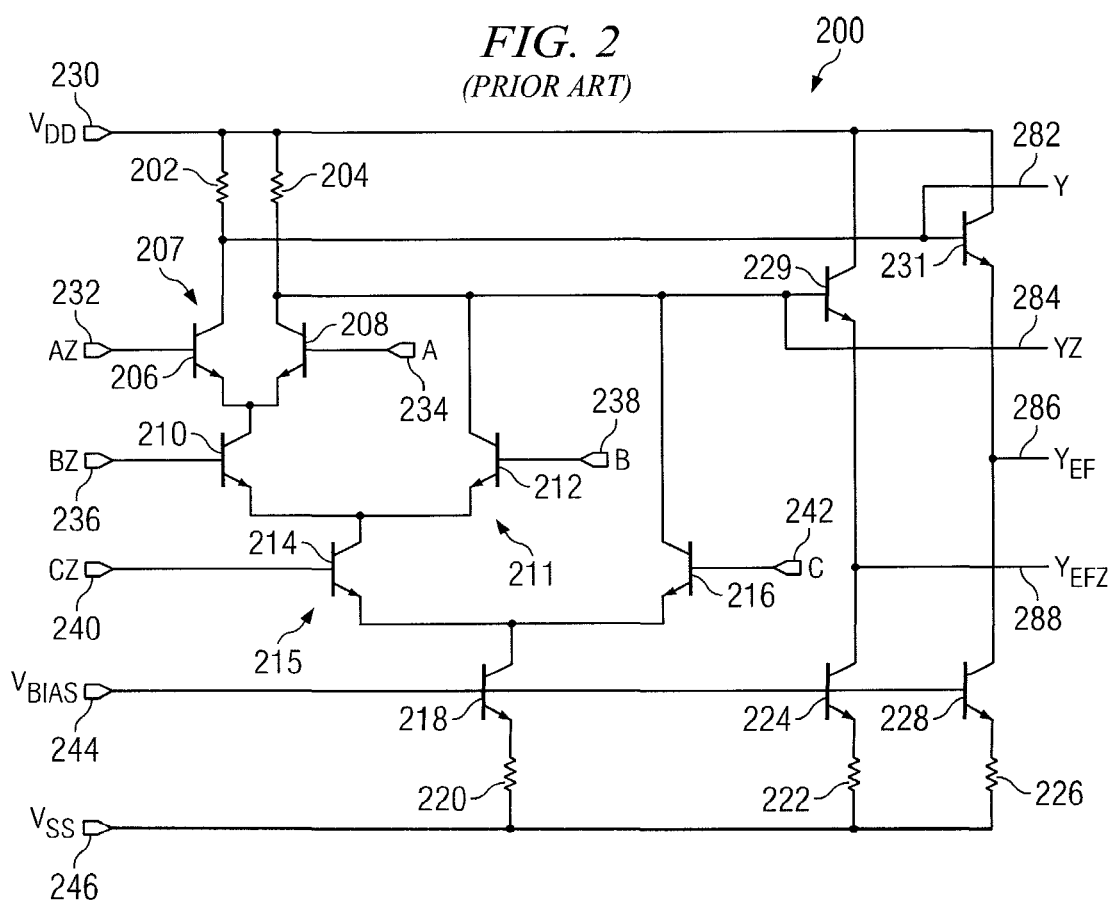
FIG. 2 depicts a prior art three input differential OR gate.
Figure 3:
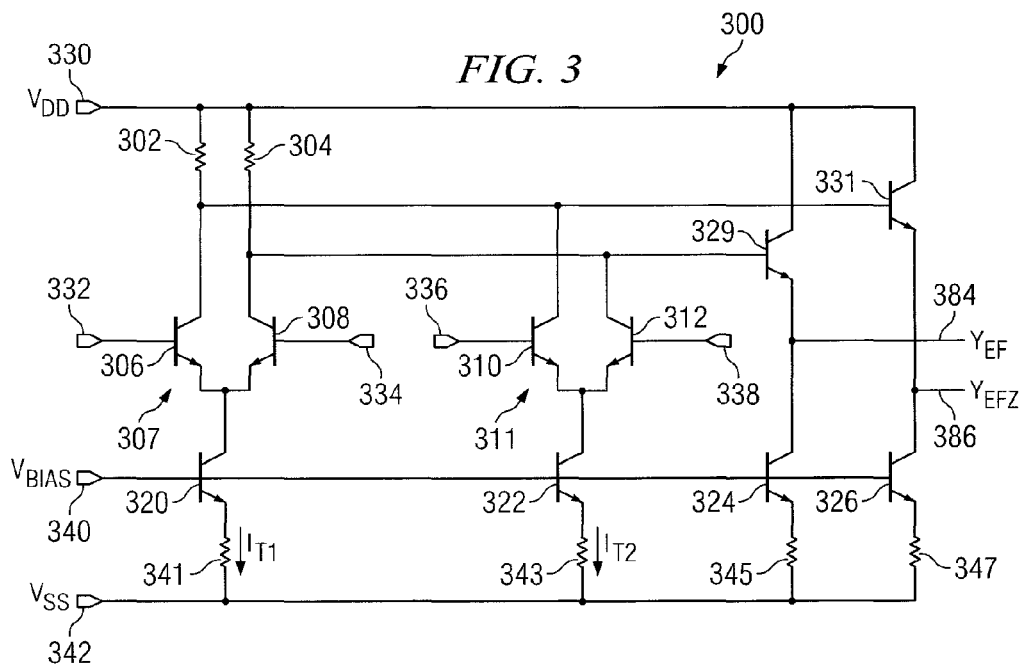
FIG. 3 shows a two input differential AND/OR gate in accordance with one or more embodiments of the present invention.

Turning to FIG. 3, a two input differential AND/OR gate 300 in accordance with various embodiments of the present invention is shown. As will be discussed more fully below, determination of whether gate 300 operates as an AND gate or as an OR gate is determined by proper selection of values for a resistor 302 and a resistor 304. As shown, gate 300 includes two differential input pairs 307, 311 in parallel with each other. One set of differential inputs 332, 334 is applied to the respective bases of a transistor 306 and a transistor 308 of differential pair 307. Another set of differential inputs 336, 338 is applied to the respective bases of a transistor 310 and a transistor 312 of differential pair 311. Differential pair 307 is biased separate from differential pair 311. In particular, differential pair 307 is biased by a current source generated by applying a bias voltage 340 to a transistor 320 that is electrically coupled to ground (VSS 342) via a resistor 341, and differential pair 311 is biased by a current source generated by applying bias voltage 340 to a transistor 322 that is electrically coupled to VSS 342 via a resistor 343.

The collector of transistor 306 and the collector of transistor 310 are electrically coupled to VDD 330 via a resistor 302, and to the base of an emitter follower transistor 331. The collector of transistor 308 and the collector of transistor 312 are electrically coupled to VDD 330 via a resistor 304, and to the base of an emitter follower transistor 329. Emitter follower transistor 331 is biased by a transistor 326 and a resistor 347, and emitter follower transistor 329 is biased by a transistor 324 and a resistor 345. Only a single set of differential outputs (YEF 384 and YEFZ 386) are provided from gate 300.

Resistor 302 and resistor 304 create an input dependent IR voltage drop (i.e., current multiplied by load resistance) from VDD 330. To create an AND gate from AND/OR gate 300, resistor 302 and resistor 304 are purposely mismatched (or scaled) such that the following conditions must both be true in order for YEF 384>YEFZ 386:

$$V_{INPUT\ 332} - V_{INPUT\ 334} > 0; \text{ and}$$

$$V_{INPUT\ 336} - V_{INPUT\ 338} > 0.$$

Due to the parallel nature of the logic architecture, three states exist at the output (YEF 384, YEFZ 386). The three states are set forth in Table 1 below where it is assumed that the current ($Y_T$) sourced via transistor 320 ($Y_{T1}$) is the same as the current sourced via transistor 322 ($Y_{T2}$):

TABLE 1

Equations for Resistive Values Used to Create an AND Gate

| $V_{INPUT\ 332} - V_{INPUT\ 334}$ | $V_{INPUT\ 336} - V_{INPUT\ 338}$ | $V_{YEF}$ | $V_{YEFZ}$ | $V_{YEF} - V_{YEFZ}$ |
|---|---|---|---|---|
| <0 | <0 | $VDD - 2 * I_T * R_{304} - V_{BE}$ | $VDD - V_{BE}$ | $-2 * I_T * R_{304}$ |
| <0 | >0 | $VDD - I_T * R_{304} - V_{BE}$ | $VDD - I_T * R_{302} - V_{BE}$ | $I_T * (R_{302} - R_{304})$ |
| >0 | <0 | $VDD - I_T * R_{304} - V_{BE}$ | $VDD - I_T * R_{302} - V_{BE}$ | $I_T * (R_{302} - R_{304})$ |
| >0 | >0 | $VDD - V_{BE}$ | $VDD - 2 * I_T * R_{302} - V_{BE}$ | $2 * I_T * R_{302}$ |

Using the above mentioned equations, values for resistor 302 and resistor 304 can be tabulated where an appropriate tail current ($Y_T$) is assumed. For example, where the tail current is set at twenty microamperes, values of 4 kOhm for resistor 302 and 12 kOhm for resistor 304 satisfy the equations of Table 1 above. Table 2 below demonstrates this by solving each of the equations of Table 1 using the aforementioned values:

TABLE 2

Solved Equations Using Exemplary Values

| $V_{INPUT\ 332} - V_{INPUT\ 334}$ | $V_{INPUT\ 336} - V_{INPUT\ 338}$ | $V_{YEF} - V_{YEFZ}$ |
|---|---|---|
| <0 | <0 | −480 mV |
| <0 | >0 | −160 mV |
| >0 | <0 | −160 mV |
| >0 | >0 | +160 mV |

As can be seen, the conditions for an AND gate are satisfied where $V_{YEF} - V_{YEFZ}$ is only greater than zero where both $V_{INPUT\ 332} - V_{INPUT\ 334} > 0$ and $V_{INPUT\ 336} - V_{INPUT\ 338} > 0$ are true. It should be noted that other combinations of values for resistor 302, resistor 304 and $Y_T$ may be used to create an AND gate in accordance with embodiments of the present invention.

In operation when an AND gate is created as set forth above, when input 332 is asserted high relative to input 334 and input 336 is asserted high relative to input 338, output YEF 384 is asserted high relative to output YEFZ 386. In this case, transistor 306 and transistor 310 are turned on. In such a condition, the tail current ($Y_{T1}$) sourced by transistor 320 and the tail current ($Y_{T2}$) sourced by transistor 322 both traverse resistor 302, and no current traverses resistor 304. Thus, the voltage at the base of emitter follower transistor 331 [VDD−($Y_{T1}+Y_{T2}$)*$R_{302}$] is lower than the voltage at the base of emitter follower transistor 329 [VDD], and YEF 384 is at a higher voltage than YEFZ 386.

In contrast, when input 332 is asserted low relative to input 334 and input 336 is asserted low relative to input 338, output YEF 384 is asserted low relative to output YEFZ 386. In this case, transistor 308 and transistor 312 are turned on. In such a condition, the tail current ($Y_{T1}$) sourced by transistor 320 and the tail current ($Y_{T2}$) sourced by transistor 322 both traverse resistor 304, and no current traverses resistor 302. Thus, the voltage at the base of emitter follower transistor 331 [VDD] is higher than the voltage at the base of emitter follower transistor 329 [VDD−($Y_{T1}+Y_{T2}$)*$R_{304}$], and YEFZ 386 is at a higher voltage than YEF 384.

In another condition, when input 332 is asserted high relative to input 334 and input 336 is asserted low relative to input 338, output YEF 384 is asserted low relative to output YEFZ 386. In this case, transistor 306 and transistor 312 are turned on. In such a condition, the tail current ($Y_{T1}$) sourced by transistor 320 traverses resistor 302, and the tail current ($Y_{T2}$) sourced by transistor 322 traverse resistor 304. Thus, the voltage at the base of emitter follower transistor 331 [VDD−$Y_{T1}$*$R_{302}$] is higher than the voltage at the base of emitter follower transistor 329 [VDD−$Y_{T2}$*$R_{304}$], as the value of resistor 302 is less than the value of resistor 304, and YEFZ 386 is at a higher voltage than YEFZ 384. The same condition occurs in the opposite condition where input 332 is asserted low relative to input 334 and input 336 is asserted high relative to input 338.

At this point, it should be noted that an OR gate can be similarly created by appropriately selecting values for resistor 302, resistor 304 and the tail current as before, but to satisfy the conditions of an OR gate. In particular, to create an OR gate from AND/OR gate 300, resistor 302 and resistor 304 are purposely mismatched (or scaled) such that the following conditions must both be true in order for YEF 384<YEFZ 386:

$$V_{INPUT\ 332} - V_{INPUT\ 334} < 0; \text{ and}$$

$$V_{INPUT\ 336} - V_{INPUT\ 338} < 0.$$

Again, due to the parallel nature of the logic architecture, three states exist at the output (YEF 384, YEFZ 386). The three states are set forth in Table 3 below where it is assumed that the current ($Y_T$) sourced via transistor 320 ($Y_{T1}$) is the same as the current sourced via transistor 322 ($Y_{T2}$):

TABLE 3

Equations for Resistive Values Used to Create an OR Gate

| $V_{INPUT\ 332} - V_{INPUT\ 334}$ | $V_{INPUT\ 336} - V_{INPUT\ 338}$ | $V_{YEF}$ | $V_{YEFZ}$ | $V_{YEF} - V_{YEFZ}$ |
|---|---|---|---|---|
| <0 | <0 | $VDD - 2 * I_T * R_{304} - V_{BE}$ | $VDD - V_{BE}$ | $-2 * I_T * R_{304}$ |
| <0 | >0 | $VDD - I_T * R_{304} - V_{BE}$ | $VDD - I_T * R_{302} - V_{BE}$ | $I_T * (R_{302} - R_{304})$ |
| >0 | <0 | $VDD - I_T * R_{304} - V_{BE}$ | $VDD - I_T * R_{302} - V_{BE}$ | |
| >0 | >0 | $VDD - V_{BE}$ | $VDD - 2 * I_T * R_{302} - V_{BE}$ | $2 * I_T * R_{302}$ |

Using the above mentioned equations, values for resistor 302 and resistor 304 can be tabulated where an appropriate tail current ($Y_T$) is assumed. For example, where the tail current is set at twenty microamperes, values of 12 kOhm for resistor 302 and 4 kOhm for resistor 304 satisfy the equations of Table 3 above. Table 4 below demonstrates this by solving each of the equations of Table 3 using the aforementioned values:

TABLE 4

Solved Equations Using Exemplary Values

| $V_{INPUT\ 332} - V_{INPUT\ 334}$ | $V_{INPUT\ 336} - V_{INPUT\ 338}$ | $V_{YEF} - V_{YEFZ}$ |
|---|---|---|
| <0 | <0 | −160 mV |
| <0 | >0 | +160 mV |
| >0 | <0 | |
| >0 | >0 | +480 mV |

As can be seen, the conditions for an OR gate are satisfied where $V_{YEF}-V_{YEFZ}$ is always greater than zero where either $V_{INPUT\ 332}-V_{INPUT\ 334}>0$ or $V_{INPUT\ 336}-V_{INPUT\ 338}>0$ are true. It should be noted that other combinations of values for resistor 302, resistor 304 and $Y_T$ may be used to create an OR gate in accordance with embodiments of the present invention.

In operation when an OR gate is created as set forth above, when input 332 is asserted high relative to input 334 and input 336 is asserted high relative to input 338, output YEF 384 is asserted high relative to output YEFZ 386. In this case, transistor 306 and transistor 310 are turned on. In such a condition, the tail current ($Y_{T1}$) sourced by transistor 320 and the tail current ($Y_{T2}$) sourced by transistor 322 both traverse resistor 302, and no current traverses resistor 304. Thus, the voltage at the base of emitter follower transistor 331 [VDD−$(Y_{T1}+Y_{T2})*R_{302}$] is lower than the voltage at the base of emitter follower transistor 329 [VDD], and YEF 384 is at a higher voltage than YEFZ 386.

In contrast, when input 332 is asserted low relative to input 334 and input 336 is asserted low relative to input 338, output YEF 384 is asserted low relative to output YEFZ 386. In this case, transistor 308 and transistor 312 are turned on. In such a condition, the tail current ($Y_{T1}$) sourced by transistor 320 and the tail current ($Y_{T2}$) sourced by transistor 322 both traverse resistor 304, and no current traverses resistor 302. Thus, the voltage at the base of emitter follower transistor 331 [VDD] is higher than the voltage at the base of emitter follower transistor 329 [VDD−$(Y_{T1}+Y_{T2})*R_{304}$], and YEFZ 386 is at a higher voltage than YEF 384.

In another condition, when input 332 is asserted high relative to input 334 and input 336 is asserted low relative to input 338, output YEF 384 is asserted high relative to output YEFZ 386. In this case, transistor 306 and transistor 312 are turned on. In such a condition, the tail current ($Y_{T1}$) sourced by transistor 320 traverses resistor 302, and the tail current ($Y_{T2}$) sourced by transistor 322 traverse resistor 304. Thus, the voltage at the base of emitter follower transistor 331 [VDD−$Y_{T1}*R_{302}$] is lower than the voltage at the base of emitter follower transistor 329 [VDD−$Y_{T2}*R_{304}$], as the value of resistor 302 is greater than the value of resistor 304. Thus, YEF 384 is at a higher voltage than YEFZ 384. The same condition occurs in the opposite condition where input 332 is asserted low relative to input 334 and input 336 is asserted high relative to input 338.

Figure 4:
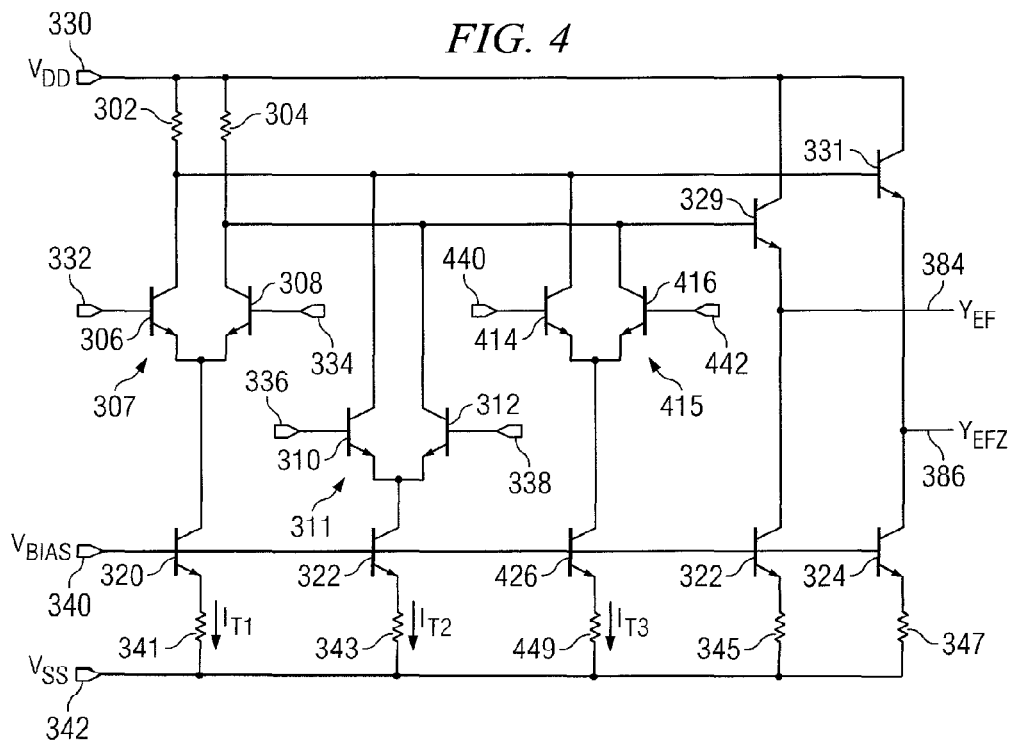
FIG. 4 depicts a three input differential AND/OR gate in accordance with various embodiments of the present invention.

Turning now to FIG. 4, the logic gate of FIG. 3 is extended to be a three input differential AND/OR gate 400 in accordance with various embodiments of the present invention. Based on the description of gate 400, one of ordinary skill in the art will appreciate the extensibility of the logic architecture of the present invention. Based on this, one of ordinary skill in the art will recognize that logic gates of four or more differential inputs may be created without impacting the head room available through the selection of VDD.

Gate 400 includes three differential input pairs 307, 311, 415 in parallel with each other. One set of differential inputs 332, 334 are applied to the respective bases of transistor 306 and transistor 308 of differential pair 307. Another set of differential inputs 336, 338 are applied to the respective bases of transistor 310 and transistor 312 of differential pair 311; and yet another set of differential inputs 440, 442 are applied to the respective bases of a transistor 414 and a transistor 416 of differential pair 415. Differential pair 307 is biased by a current source generated by applying bias voltage 340 to transistor 320 that is electrically coupled to ground (VSS 342) via resistor 341; differential pair 311 is biased by a current source generated by applying bias voltage 340 to transistor 322 that is electrically coupled to VSS 342 via resistor 343; and differential pair 415 is biased by a current source generated by applying bias voltage 340 to a transistor 426 that is electrically coupled to VSS 342 via a resistor 449.

The collector of transistor 306, the collector of transistor 310 and the collector of transistor 414 are electrically coupled to VDD 330 via resistor 302, and to the base of emitter follower transistor 331. The collector of transistor 308, the collector of transistor 312 and the collector of transistor 416 are electrically coupled to VDD 330 via resistor 304, and to the base of emitter follower transistor 329. Emitter follower transistor 331 is biased by transistor 324 and resistor 347, and emitter follower transistor 329 is biased by transistor 324 and resistor 345. Only a single set of differential outputs (YEF 384 and YEFZ 386) are provided from gate 300.

As with the two input gate of FIG. 3, resistor 302 and resistor 304 create an input dependent IR voltage drop from VDD 330. To create an AND gate from AND/OR gate 400, resistor 302 and resistor 304 are purposely mismatched (or scaled) such that the following conditions must both be true in order for YEF 384>YEFZ 386:

$V_{INPUT\,332} - V_{INPUT\,334} > 0;$ $V_{INPUT\,336} - V_{INPUT\,338} > 0;$ and $V_{INPUT\,440} - V_{INPUT\,442} > 0.$ Again, due to the parallel nature of the logic architecture, five states exist at the output (YEF 384, YEFZ 386). The five states are set forth in Table 5 below where it is assumed that the current ($Y_T$) sourced via transistor 320 ($Y_{T1}$) is the same as the current sourced via transistor 322 ($Y_{T2}$) and that ($Y_{T3}$) sourced via transistor 426:

tor 302, and no current traverses resistor 304. Thus, the voltage at the base of emitter follower transistor 331 [VDD–$(Y_{T1}+I_{T2}+I_{T3})*R_{302}$] is lower than the voltage at the base of emitter follower transistor 329 [VDD], and YEF 384 is at a higher voltage than YEFZ 386.

In contrast, when all of input 332 is asserted low relative to input 334, input 336 is asserted low relative to input 338, and input 440 is asserted low relative to input 442, output YEF 384 is asserted low relative to output YEFZ 386. In this case, transistor 308, transistor 312 and transistor 416 are turned on. In such a condition, the tail current ($I_{T1}$) sourced by transistor

TABLE 5

Equations for Resistive Values Used to Create an AND Gate

| $V_{INPUT\,332} - V_{INPUT\,334}$ | $V_{INPUT\,336} - V_{INPUT\,338}$ | $V_{INPUT\,440} - V_{INPUT\,442}$ | $V_{YEF}$ | $V_{YEFZ}$ | $V_{YEF} - V_{YEFZ}$ |
|---|---|---|---|---|---|
| <0 | <0 | <0 | VDD – 3 * $I_T$ * $R_{304}$ – $V_{BE}$ | VDD – $V_{BE}$ | –3 * $I_T$ * $R_{304}$ |
| <0 | <0 | >0 | VDD – 2 * $I_T$ * $R_{304}$ – $V_{BE}$ | VDD – $I_T$ * $R_{302}$ – $V_{BE}$ | $I_T$ * ($R_{302}$ – 2 * $R_{304}$) |
| <0 | >0 | <0 | VDD – 2 * $I_T$ * $R_{304}$ – $V_{BE}$ | VDD – $I_T$ * $R_{302}$ – $V_{BE}$ | $I_T$ * ($R_{302}$ – 2 * $R_{304}$) |
| <0 | >0 | >0 | VDD – $I_T$ * $R_{304}$ – $V_{BE}$ | VDD – 2 * $I_T$ * $R_{302}$ – $V_{BE}$ | $I_T$ * (2 * $R_{302}$ – $R_{304}$) |
| >0 | <0 | <0 | VDD – 2 * $I_T$ * $R_{304}$ – $V_{BE}$ | VDD – $I_T$ * $R_{302}$ – $V_{BE}$ | $I_T$ * ($R_{302}$ – 2 * $R_{304}$) |
| >0 | <0 | >0 | VDD – $I_T$ * $R_{304}$ – $V_{BE}$ | VDD – 2 * $I_T$ * $R_{302}$ – $V_{BE}$ | $I_T$ * (2 * $R_{302}$ – $R_{304}$) |
| >0 | >0 | <0 | VDD – $I_T$ * $R_{304}$ – $V_{BE}$ | VDD – 2 * $I_T$ * $R_{302}$ – $V_{BE}$ | $I_T$ * (2 * $R_{302}$ – $R_{304}$) |
| >0 | >0 | >0 | VDD – $V_{BE}$ | VDD – 3 * $I_T$ * $R_{302}$ – $V_{BE}$ | 3 * $I_T$ * $R_{302}$ |

Using the above mentioned equations, values for resistor 302 and resistor 304 can be tabulated where an appropriate tail current ($Y_T$) is assumed. For example, where the tail current is set at fifteen microamperes, values of 4 kOhm for resistor 302 and 12 kOhm for resistor 304 satisfy the equations of Table 5 above to yield a logical AND function. Table 6 below demonstrates this by solving each of the equations of Table 5 using the aforementioned values:

TABLE 6

Solved Equations Using Exemplary Values

| $V_{INPUT\,332} - V_{INPUT\,334}$ | $V_{INPUT\,336} - V_{INPUT\,338}$ | $V_{INPUT\,440} - V_{INPUT\,442}$ | $V_{YEF} - V_{YEFZ}$ |
|---|---|---|---|
| <0 | <0 | <0 | –540 mV |
| <0 | <0 | >0 | –300 mV |
| <0 | >0 | <0 | –300 mV |
| <0 | >0 | >0 | –60 mV |
| >0 | <0 | <0 | –300 mV |
| >0 | <0 | >0 | –60 mV |
| >0 | >0 | <0 | –60 mV |
| >0 | >0 | >0 | +180 mV |

As can be seen, the conditions for an AND gate are satisfied where $V_{YEF} - V_{YEFZ}$ is only greater than zero where all of $V_{INPUT\,332} - V_{INPUT\,334} > 0$, $V_{INPUT\,336} - V_{INPUT\,338} > 0$ and $V_{INPUT\,440} - V_{INPUT\,442} > 0$ are true. It should be noted that other combinations of values for resistor 302, resistor 304 and $Y_T$ may be used to create an AND gate in accordance with embodiments of the present invention.

In operation when an AND gate is created as set forth above, when input 332 is asserted high relative to input 334, input 336 is asserted high relative to input 338, and input 440 is asserted high relative to input 442, output YEF 384 is asserted high relative to output YEFZ 386. In this case, transistor 306, transistor 310 and transistor 414 are turned on. In such a condition, the tail current ($Y_{T1}$) sourced by transistor 320, the tail current ($Y_{T2}$) sourced by transistor 322, and the tail current ($Y_{T3}$) sourced by transistor 426 all traverse resis-

320, the tail current ($I_{T2}$) sourced by transistor 322, and the tail current ($I_{T3}$) sourced by transistor 426 all traverse resistor 304, and no current traverses resistor 302. Thus, the voltage at the base of emitter follower transistor 331 [VDD] is higher than the voltage at the base of emitter follower transistor 329 [VDD–$(I_{T1}+I_{T2}+I_{T3})*R_{304}$], and YEFZ 386 is at a higher voltage than YEFZ 384.

In all other conditions, output YEF 384 is asserted low relative to output YEFZ 386. In this case, one or two of transistor 306, transistor 310 and transistor 414 are turned on, while one or two of transistor 308, transistor 312 and transistor 416 are turned off. In such a condition, one or two of the tail currents ($I_{T1}$, $I_{T2}$, $I_{T3}$) traverse resistor 302 and one or two of the tail currents ($I_{T1}$, $I_{T2}$, $I_{T3}$) traverses resistor 304. Thus, where it is assumed that each of the tail currents are equal, the voltage at the base of emitter follower transistor 331 [VDD–$I_{T1}*R_{302}$, or VDD–$2*I_{T1}*R_{302}$] is higher than the voltage at the base of emitter follower transistor 329 [VDD–$I_{T1}*R_{304}$, or VDD–$2*I_{T1}*R_{304}$], as the value of resistor 302 is less than half the value of resistor 304, and YEFZ 386 is at a higher voltage than YEF 384. The same condition occurs in the opposite condition where input 332 is asserted low relative to input 334 and input 336 is asserted high relative to input 338.

At this point, it should be noted that an OR gate can be similarly created by appropriately selecting values for resistor 302, resistor 304 and the tail current as before, but to satisfy the conditions of an OR gate similar to that discussed above in relation to FIG. 3.

Based on the disclosure provided herein, one of ordinary skill in the art will appreciate a variety of advantages that may be had through implementing logic using the architecture of the present invention. For example, using the present architecture, stacked devices are eliminated which enabled operation from lower supply voltages and the resulting power reductions. In addition, a purely differential logic family may be developed, as opposed to a single ended emitter coupled logic family that trades off noise margins. Yet further, more complex logic functions may be implemented at a given supply voltage. For example, a four or more input device may be implemented which may not be possible using the same supply voltage level in a stacked architecture. Yet further, the input common-mode range is increased because the transistors are not stacked. As such, a designer need only maintain saturation in the tail devices. Each differential pair exhibits increased common-mode range compared to having any cascoded devices between the differential pair and a resistive load. Yet further, all input common-modes are decoupled from one another, thus there is no need to level shift outputs up or down to accommodate downstream logic. In addition, the typical speed for a given level of current consumption can be greater since fewer level shifters equals less loading. Also, for some cases of fully differential ECL designs, emitter followers cannot be used which dramatically slows down operation. One or more of the aforementioned advantages, or other unlisted advantages may be had in accordance with one or more embodiments of the present invention.

While only a two input AND/OR gate and a three input AND/OR gate have been presented herein, based on the disclosure provided herein, one of ordinary skill in the art will recognize a variety of other gate types that may be implemented consistent with the architecture disclosed herein, and in accordance with various embodiments of the present invention. As an example, the architecture set forth herein may also be used for, but is not limited to, creating differential NAND and NOR gates.

In conclusion, the present invention provides novel systems, devices, methods for implementing and using parallel emitter coupled logic. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for implementing logic, the method comprising:
   providing a first differential input pair;
   providing a second differential input pair;
   providing a first emitter follower transistor:
   providing a second emitter follower transistor:
   wherein the collector of a first transistor of the first differential pair is electrically coupled to the collector of a first transistor of the second differential pair, and to an upper voltage via a first resistor, and to a base of the first emitter follower transistor;
   wherein the collector of a second transistor of the first differential pair is electrically coupled to the collector of a second transistor of the second differential pair, and to the upper voltage via a second resistor, and to a base of the second emitter follower transistor; and
   selecting a first resistive value associated with the first resistor to be different from a second resistive value associated with the second resistor, wherein the difference between the first resistive value and the second resistive value yields a particular type of logic gate having a differential output at an emitter of the first emitter follower transistor and an emitter of the second emitter follower transistor.

2. The method of claim 1, wherein the particular type of logic gate is selected from a group consisting of: an AND gate and an OR gate.

3. The method of claim 1, wherein the particular type of logic gate is an AND gate, and wherein the method further comprises:
   applying a first differential input to the first differential input pair;
   applying a second differential input to the second differential input pair; and
   wherein an output of the AND gate is an AND function of the first differential input and the second differential input.

4. The method of claim 1, wherein the particular type of logic gate is an OR gate, and wherein the method further comprises:
   applying a first differential input to the first differential input pair;
   applying a second differential input to the second differential input pair; and
   wherein an output of the OR gate is an OR function of the first differential input and the second differential input.

5. The method of claim 1, wherein the first resistor comprises an active resistor.

6. The method of claim 5, wherein the second resistor comprises an active resistor.

7. A differential logic gate, the logic gate comprising:
   a first differential input pair, wherein the first differential pair receives a first differential input;
   a second differential pair, wherein the second differential pair receives a second differential input;
   a first emitter follower transistor;
   a second emitter follower transistor;
   wherein the collector of a first transistor of the first differential pair is electrically coupled to the collector of a first transistor of the second differential pair, and to an upper voltage via a first resistor, and to a base of the first emitter follower transistor; and
   wherein the collector of a second transistor of the first differential pair is electrically coupled to the collector of a second transistor of the second differential pair, and to the upper voltage via a second resistor, and to a base of the second emitter follower transistor, the differential logic gate further comprising a differential output at an emitter of the first emitter follower transistor and an emitter of the second emitter follower transistor.

8. The logic gate of claim 7, wherein the first resistor exhibits a first resistive value, wherein the second resistor exhibits a second resistive value, wherein the first resistive value is different from the second resistive value, and wherein the difference between the first resistive value and the second resistive values yields an AND gate.

9. The logic gate of claim 7, wherein the first resistor exhibits a resistive value, wherein the second resistor exhibits a second resistive value, wherein the first resistive value is different from the second resistive value, and wherein the difference between the first resistive value and the second resistive values yields an OR gate.

10. The logic gate of claim 7, wherein the first resistor comprises an active resistor.

11. The logic gate of claim 10, wherein the second resistor comprises an active resistor.

12. The logic gate of claim 7, wherein the logic gate includes a differential output at a single offset level.

13. The logic gate of claim 7, wherein the logic gate further comprises:
   a third differential pair, wherein the third differential pair receives a third differential input;
   wherein the collector of a first transistor of the third differential pair is electrically coupled to the upper voltage via the first resistor; and wherein the collector of a second transistor of the third differential pair is electrically coupled to the upper voltage via the second resistor.

14. The logic gate of claim 13, wherein the first resistor exhibits a first resistive value; wherein the second resistor exhibits a second resistive value; wherein the first resistive value is different from the second resistive value; wherein the difference between the first resistive value and the second resistive values yields an AND gate; and wherein the AND gate applies an AND function to the combination of the first differential input, the second differential input and the third differential input.

15. The logic gate of claim 13, wherein the first resistor exhibits a first resistive value; wherein the second resistor exhibits a second resistive value; wherein the first resistive value is different from the second resistive value; wherein the difference between the first resistive value and the second resistive values yields an OR gate; and wherein the OR gate applies an OR function to the combination of the first differential input, the second differential input and the third differential input.

16. The logic gate of claim 7, wherein an emitter of the first transistor of the first differential pair and an emitter of the second transistor of the first differential pair are electrically coupled to a common bias circuit.

17. The logic gate of claim 16, wherein the common bias circuit is a first common bias circuit, wherein the emitter of the first transistor of the second differential pair and the emitter of the second transistor of the second differential pair are electrically coupled to a second common bias circuit.

18. A differential logic gate, the logic gate comprising:
a first differential input pair, wherein the first differential pair receives a first differential input;
a second differential pair, wherein the second differential pair receives a second differential input;
a first emitter follower transistor;
a second emitter follower transistor;
wherein the first differential pair is in parallel with the second differential pair; wherein the collector of each of a first transistor of the first differential pair and a first transistor of the second differential pair are electrically coupled to an upper voltage via a first resistor and to a base of the first emitter follower transistor; and wherein the collector of each of a second transistor of the first differential pair and a second transistor of the second differential pair are electrically coupled to the upper voltage via a second resistor and to a base of the second emitter follower transistor, the differential logic gate further comprising a differential output at an emitter of the first emitter follower transistor and an emitter of the second emitter follower transistor; and
wherein the first resistor exhibits a first resistive value, wherein the second resistor exhibits a second resistive value, wherein the first resistive value is different from the second resistive value, and wherein the difference between the first resistive value and the second resistive values yields a particular type of logic gate selected from a group consisting of: an AND gate, and an OR gate.

19. The logic gate of claim 18, wherein the first resistor and the second resistor comprise active resistors.

20. The logic gate of claim 18, wherein the logic gate includes a differential output at a single offset level.

* * * * *